(12) United States Patent
Han

(10) Patent No.: US 7,560,674 B2
(45) Date of Patent: Jul. 14, 2009

(54) CMOS IMAGE SENSOR AND METHOD FOR MANUFACTURING THE SAME

(75) Inventor: Chang Hun Han, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/486,489

(22) Filed: Jul. 13, 2006

(65) Prior Publication Data

US 2007/0012863 A1   Jan. 18, 2007

(30) Foreign Application Priority Data

Jul. 15, 2005   (KR) ...................... 10-2005-0064255

(51) Int. Cl.
*H01L 27/00* (2006.01)

(52) U.S. Cl. ................. 250/200; 250/208.1; 250/214.1; 250/226; 257/440; 257/432; 257/436

(58) Field of Classification Search .............. 250/214.1, 250/226; 257/440, 432, 436
See application file for complete search history.

(56) References Cited

U.S. PATENT DOCUMENTS

| 7,041,956 | B2 | 5/2006 | Takahashi et al. | |
|---|---|---|---|---|
| 2004/0000669 | A1 | 1/2004 | Yamamura | |
| 2005/0186754 | A1* | 8/2005 | Kim | .......................... 438/401 |
| 2006/0054946 | A1* | 3/2006 | Baek et al. | .................. 257/292 |
| 2006/0113622 | A1* | 6/2006 | Adkisson et al. | ............. 257/443 |
| 2006/0267013 | A1* | 11/2006 | Adkisson et al. | ............... 257/59 |

FOREIGN PATENT DOCUMENTS

CN   1574378 A   2/2005

OTHER PUBLICATIONS

Shingo Takahashi, Yoshiyuki Enomoto and Hideshi Abe; "Solid-State Image Pickup Device"; esp@cenet; Abstract of Chinese Publication No. CN1574378; Publication Date: Feb. 2, 2002; esp@cenet Database—Worldwide; http://v3.espacenet.com/textdoc?DB-EPODOC&IDX=CN1574378&F=0&QPN=CN157.
Chinese Office Action dated Mar. 28, 2008 and English Translation; Chinese Patent Application No. 200610099405.0; State Intellectual Property Office of People's Republic of China, People's Republic of China.

* cited by examiner

*Primary Examiner*—Seung C Sohn
(74) *Attorney, Agent, or Firm*—The Law Offices of Andrew D. Fortney; Andrew D. Fortney

(57) ABSTRACT

Disclosed are a CMOS image sensor and a manufacturing method thereof. The present CMOS image sensor comprises: first, second, and third photo diodes and a plurality of transistors spaced at a predetermined distance in a semiconductor substrate; a diffusion blocking layer on substantially an entire surface of the substrate, including an opening therein exposing at least one of the photo diodes; an interlevel dielectric layer over the entire surface of the substrate, covering the diffusion blocking layer; first, second and third color filter layers over the interlevel dielectric layer, respectively corresponding to the first, second and third photo diodes, and a plurality of microlenses over the color filter layers, corresponding to each color filter layer.

20 Claims, 10 Drawing Sheets

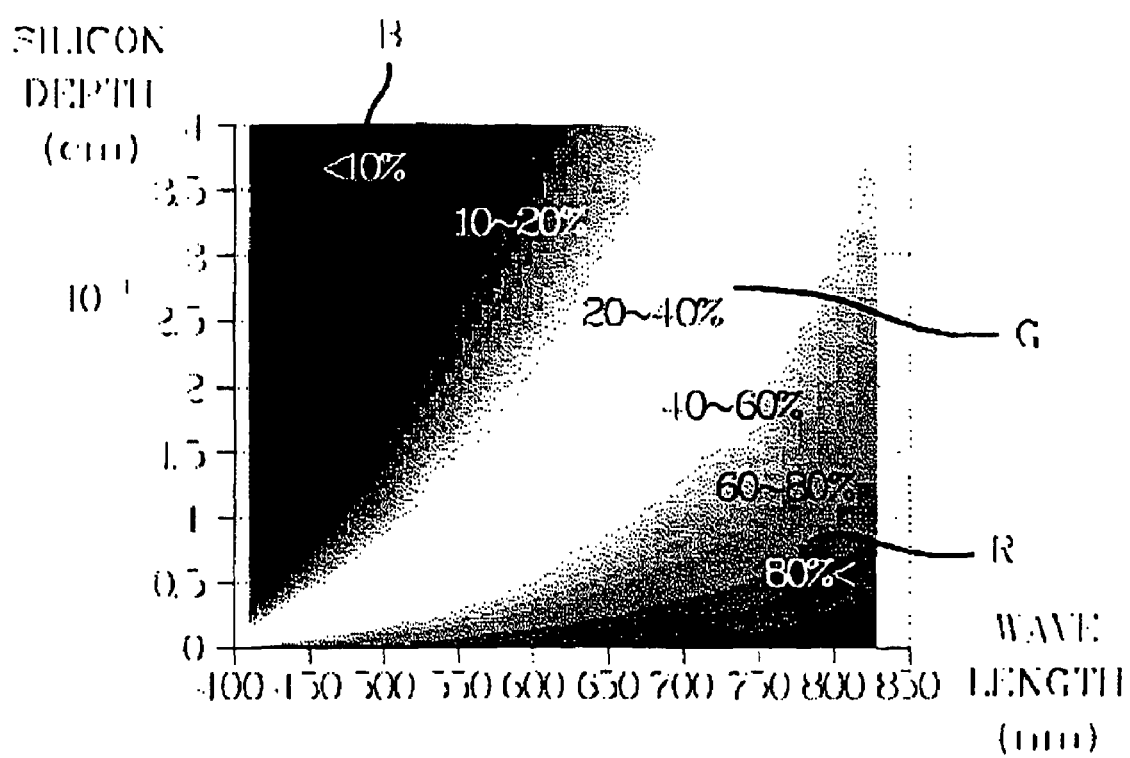

CMOS IMAGE SENSOR AND METHOD FOR MANUFACTURING THE SAME

BACKGROUND OF THE INVENTION

1. Field of the Invention

The present invention relates to an image sensor, and more specifically, to a complementary metal oxide semiconductor (CMOS) image sensor and manufacturing method thereof.

2. Description of the Related Art

Conventionally, an image sensor, as a kind of semiconductor device, transforms optical images into electrical signals. Image sensors can be generally classified into charge coupled devices (CCDs) and CMOS image sensors.

A CCD comprises a plurality of photo diodes arranged in the form of matrix to transforms optical signals into electrical signals, a plurality of vertical charge coupled devices (VCCDs) formed between the photo diodes to transmit charges generated in each photo diode in a vertical direction, a plurality of horizontal charge coupled devices (HCCDs) for transmitting charges transmitted from each VCCDs in a horizontal direction, and a sense amplifier for sensing charges transmitted in the horizontal direction to output electrical signals.

It has been generally known that CCDs have complicated operational mechanisms and high power consumption. In addition, its manufacturing method is relatively complicated, because multiple photolithographic steps are required in its fabrication. Especially, it is difficult to integrate a CCD with other devices such as control circuits, signal processing circuits, analog/digital converters. etc., in a single chip. Such disadvantages of CCD hinder miniaturization of products.

In order to overcome the above described disadvantages of CCDs, CMOS image sensors have been recently developed as the oncoming generation of image sensor. A CMOS image sensor generally comprises MOS transistors formed in a semiconductor substrate by CMOS fabrication technologies. In a CMOS image sensor, the MOS transistors are formed relative to the number of unit pixels, along with peripheral circuits such as control circuits, signal processing circuits, and the like. CMOS image sensors employ a switching mode that MOS transistors successively detect the output of each pixel.

More specifically, CMOS image sensors comprise a photo diode and a number of MOS transistors in each pixel, thereby successively detecting electrical signals of each pixel in a switching mode to express a given image.

The CMOS image sensor has advantages such as low power consumption and relatively simple fabrication process. In addition, CMOS image sensors can be integrated with control circuits, signal processing circuits, analog/digital converter, etc.. because CMOS manufacturing technologies are used, which enables miniaturization of products.

CMOS image sensors have been widely used in a variety of applications such as digital still cameras, digital video cameras, cellular phones, and the like.

Meanwhile, CMOS image sensors can also be classified into 3T, 4T, 5T types, etc., according to the number of transistors per unit pixel. The 3T type of CMOS image sensor comprises one photo diode and three transistors per unit pixel, and the 4T type comprises one photo diode and four transistors per Unit pixel. Here, a layout of unit pixel in a 4T type of CMOS image sensor is configured as follows.

FIG. 1 is a circuit diagram of a conventional 4T type of CMOS image sensor. FIG. 2 is a layout of unit pixel in the conventional 4T type of CMOS image sensor.

As shown in FIG. 1, each unit pixel 100 of the conventional CMOS image sensor comprises a photo diode 10 functioning as a photoelectric transformer, and four transistors including a transfer transistor 20, a reset transistor 30, a driver transistor 40, and a select transistor 50. In addition, the output terminal (referred to as "OUT") of the each unit pixel 100 is electrically connected to a load transistor 60.

In FIG. 1, the reference symbol "FD" represents a floating diffusion region, "Tx" represents a gate voltage of the transfer transistor 20, "Rx" represents a gate voltage of the reset transistor 30, "Dx" represents a gate voltage of the driver transistor 40, and finally "Sx" represents a gate voltage of the select transistor 50.

As shown in FIG. 2, in the conventional CMOS image sensor, an active region is defined in a portion of each unit pixel, and an isolation layer is formed in the remaining portion of each unit pixel except for the active region. One photo diode PD is formed in a large portion of the defined active region, and gate electrodes 23, 33, 43, and 53 of four transistors are respectively formed to overlap with other portion(s) of the active region.

The gate electrode 23 constitutes part of the transfer transistor 20. The gate electrode 33 constitutes part of the reset transistor 30. The gate electrode 43 constitutes part of the driver transistor 40. And, the gate electrode 53 constitutes part of the select transistor 50.

Here, dopant ions are implanted in the active region where each transistor is formed, except for the portion of active region below each gate electrodes 23, 33, 43, and 53, to form source and drain regions of each transistor.

FIG. 3 is a cross-sectional view illustrating a CMOS image sensor manufactured according a conventional method.

As shown in FIG. 3, a P– type epitaxial layer 101 is formed on a P++ type semiconductor substrate 100 in which an active region (including a photo diode region and a transistor region) and an isolation region are defined. In addition, a field oxide layer 102 is formed in the isolation region of the substrate 100 for isolation of green, red, and blue light absorption regions. Moreover, an N– type diffusion region 103 is formed in the photo diode region of the substrate 100.

In addition, gate electrodes 105 are formed on the transistor region of the substrate 100, and gate insulating layers 104 are interposed between the substrate 100 and the gate electrodes 105. Insulating sidewalls 106 are formed on sides of each gate electrode 105. Moreover, a diffusion blocking layer 108 is formed over the entire surface of the substrate 100, covering the gate electrodes 105. An interlevel dielectric layer 109 is formed on the diffusion blocking layer 108. And, various metallization layers or wirings 110 are formed and spaced on the interlevel dielectric layer 109.

In addition, a first planarization layer 111 is formed over the entire surface of the substrate 100, covering the metallization wirings 110. Furthermore, red (R), green (Cs), and blue (B) color filter layers 112 are formed on the first planarization layer 111, respectively corresponding to each N– type diffusion region 103.

Then, a second planarization layer 113 is formed over the entire surface of the substrate 100, covering the color filter layers 112. Plural microlenses 114 are formed on the second planarization layer 113, respectively corresponding to each color filter layer 112. Here, the reference numeral "107" represents source/drain diffusion regions of each transistor.

FIG. 4a is a graph illustrating changes of absorption coefficient and penetration depth according to the wavelength of incident light, and FIG. 4b is a graph illustrating a percentage of the penetration depth to the wavelength of light incident to a photo diode region in a conventional CMOS image sensor.

As shown in FIG. 4a, red light penetrates up to 10 μm, deeper than light of other colors. In general, in the case of a RGB system, it is difficult to reproduce all colors of light in uniform proportions (i.e., 1:1:1). As a result, in color-reproduction, a CMOS image sensor rarely has an ideal proportion of 1:1:1, so that color-reproducibility characteristics are less than ideal.

In addition, as shown in FIG. 4b, the penetration region of red light having a wavelength of about 700 nm reaches up to 4000 Å~15000 Å below a surface of a semiconductor substrate, while the penetration region of blue or green light mainly reaches to 4000 Å or less. In other words, when comparing the amounts of penetrated light detected by the conventional CMOS image sensor, red light represents 60% or more of the penetrated/detected light, green light represents about 20%~40% of the penetrated/detected light, and blue light represents about 20% or less of the penetrated/detected light.

Especially, in the above-described conventional CMOS image sensor, a diffusion blocking layer 108 of a nitride material is formed before forming the interlevel dielectric layer 109, and the nitride layer can reduce the dynamic range of the photo diode region as the CMOS image sensor is scaled down (e.g., as the size/area of tile photo diode region decreases). Accordingly, it is more difficult to reproduce all colors in an ideal proportion, because of the relatively low transmittance of other color lights, especially, blue color light.

SUMMARY OF THE INVENTION

It is, therefore, an object of the present invention to provide a CMOS image sensor of which color reproducibility can be improved by compensation for a low transmittance of blue light. In addition, another object of the present invention is to provide a method for manufacturing a CMOS image sensor having superior color reproducibility.

To achieve the above objects, an embodiment of a CMOS image sensor according to the present invention, comprises: first, second, and third photo diodes and a plurality of transistors spaced at a predetermined distance in a semiconductor substrate; a diffusion blocking layer on substantially an entire surface of the substrate, including an opening exposing at least one of the photo diodes; an interlevel dielectric layer over the entire surface of the substrate, covering the diffusion blocking layer, first, second and third color filter layers over the interlevel dielectric layer, respectively corresponding to the first, second and third photo diodes; and a plurality of microlenses formed over the color filter layers, corresponding to each color filter layer.

In addition, a method for manufacturing a CMOS image sensor according to the present invention, comprises the steps of: forming first, second, and third photo diodes and a plurality of transistors spaced at a predetermined distance in a semiconductor substrate; forming a diffusion blocking layer on an entire surface of the substrate; selectively removing a portion of the diffusion blocking layer to form an opening exposing at least one of the photo diodes; forming an interlevel dielectric layer over the entire surface of the substrate; forming red, blue, and green color filter layers over the interlevel dielectric layer, respectively corresponding to the first to third photo diodes; and forming a plurality of microlenses over the color filter layers, respectively corresponding to each color filter layer.

These and other aspects of the invention will become evident by reference to the following description of the invention, often referring to the accompanying drawings.

BRIEF DESCRIPTION OF DRAWINGS

FIG. 4b is a graph illustrating a percentage of the penetration depth to the wavelength of light incident to a photo diode region in a conventional CMOS image sensor.

DETAILED DESCRIPTION OF THE INVENTION

Hereinafter, preferred embodiments of a CMOS image sensor and a manufacturing method thereof according to the present invention will be described in detail, referring to the accompanying drawings.

Figure 1:
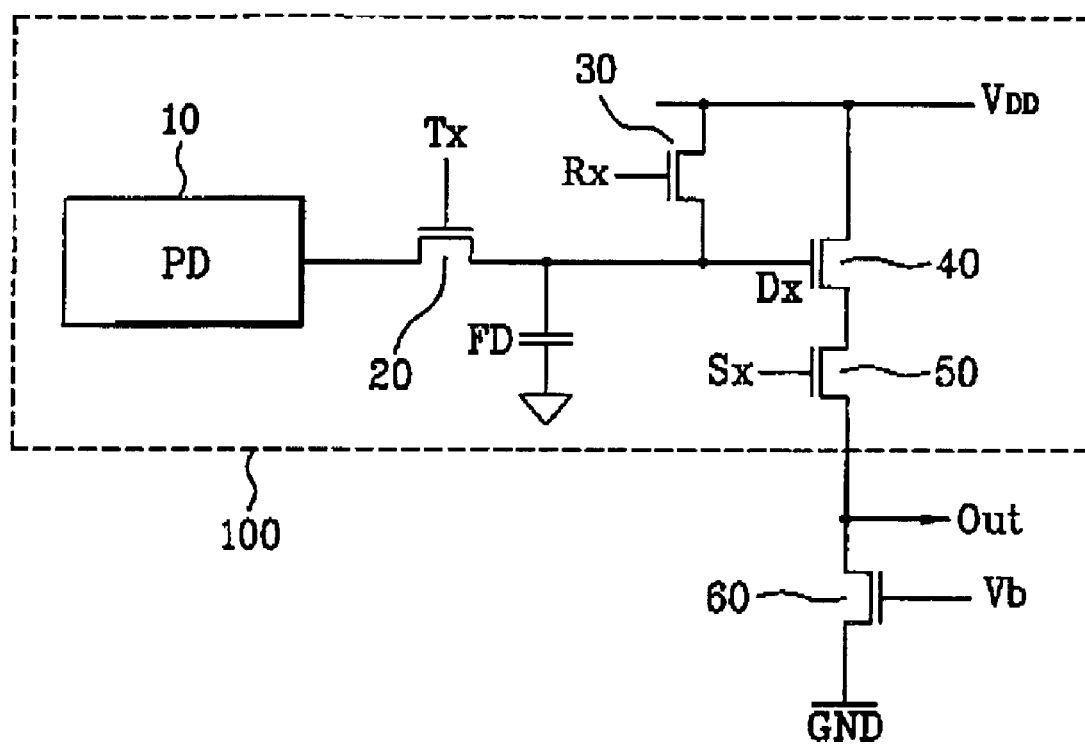
FIG. 1 is a circuit diagram of a conventional 4T type of CMOS image sensor.
Figure 2:
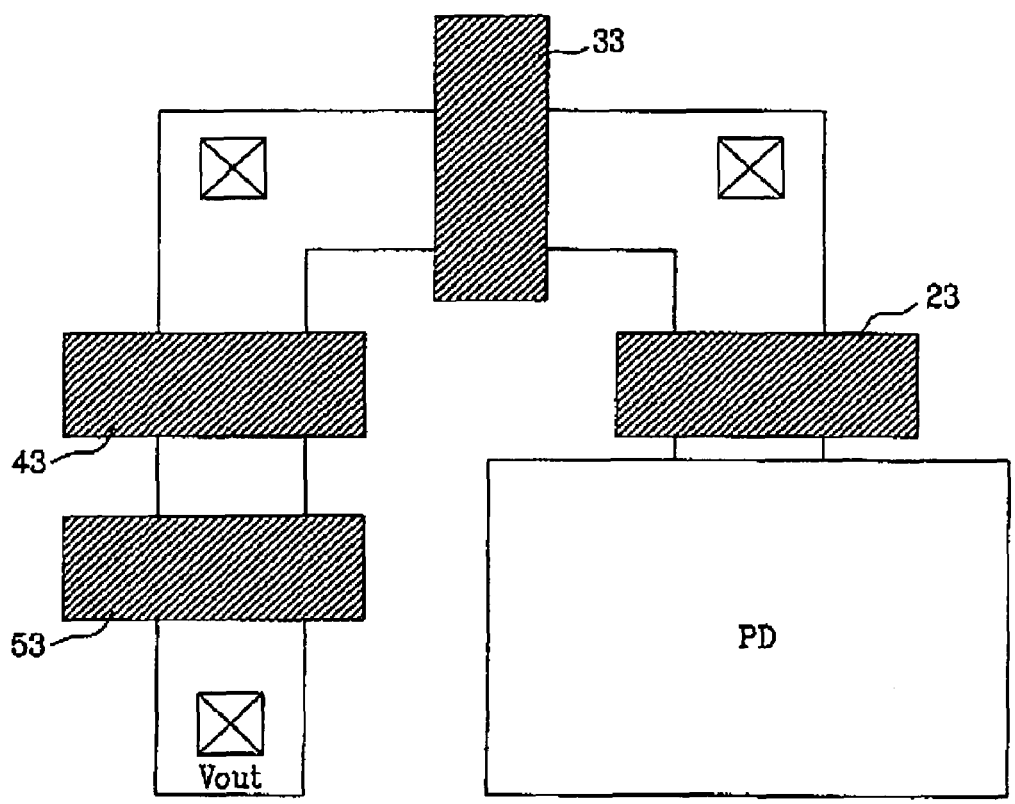
FIG. 2 is a layout of unit pixel in the conventional 4T type of CMOS image sensor.
Figure 3:
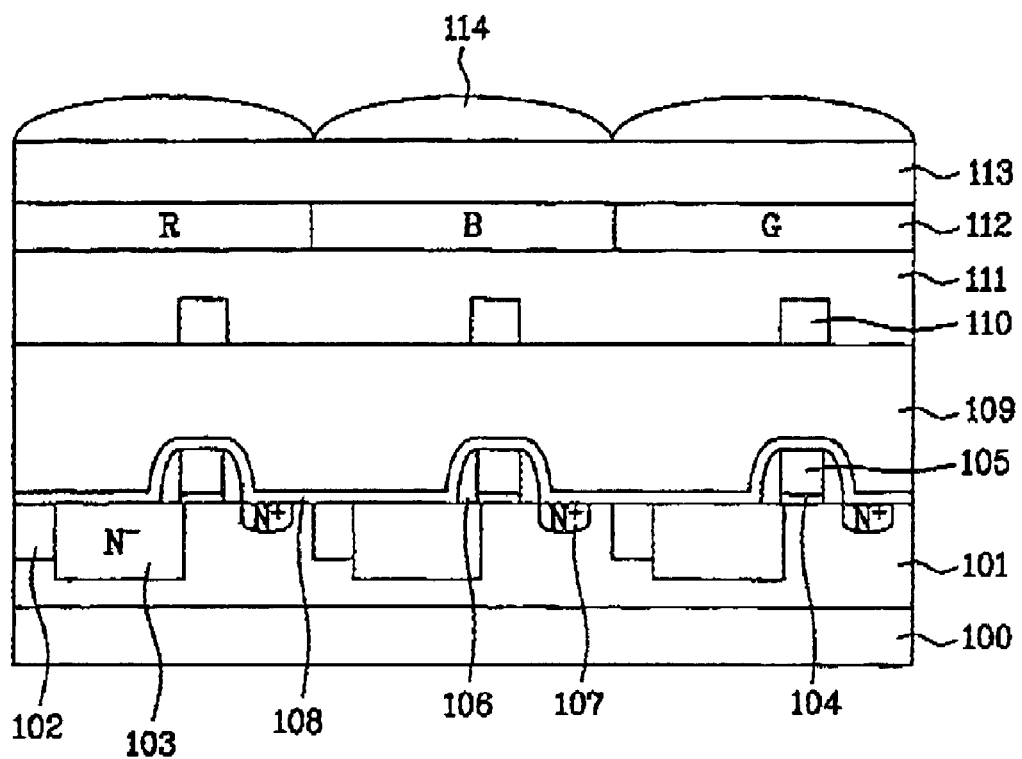
FIG. 3 is a cross-sectional view illustrating a CMOS image sensor manufactured according a conventional method.
Figure 4A:
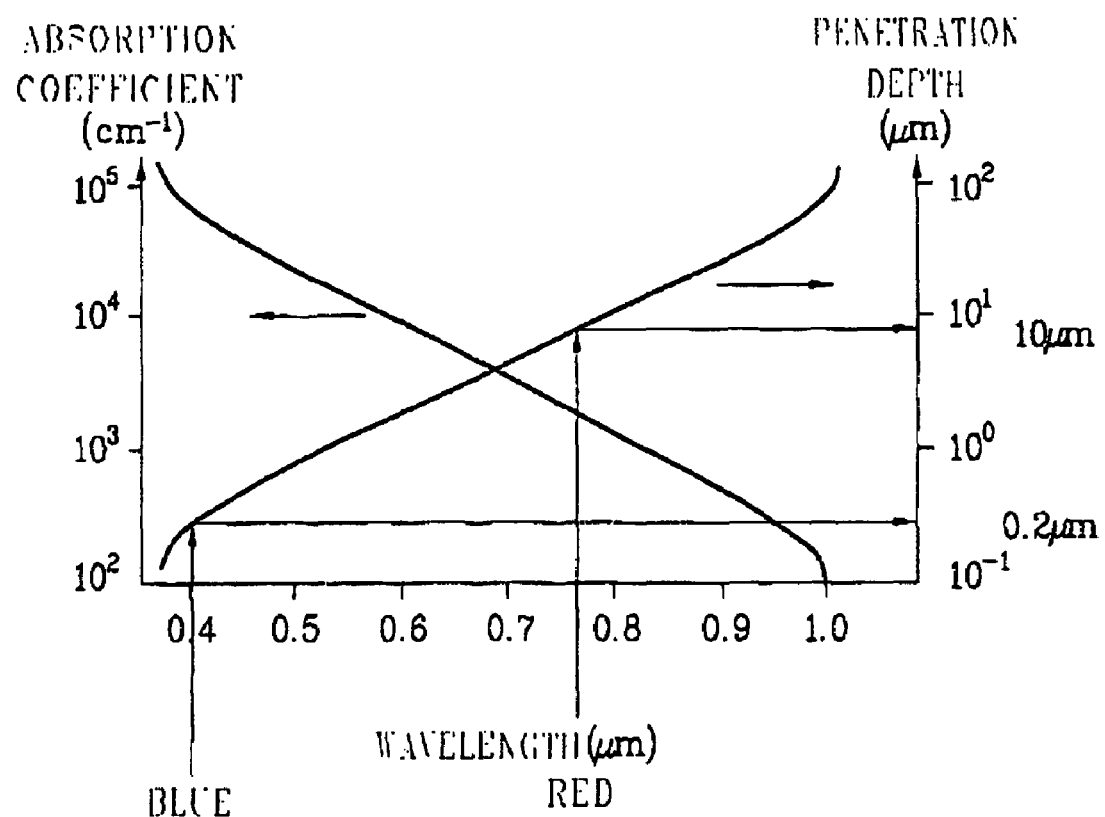
FIG. 4a is a graph illustrating changes of absorption coefficient and penetration depth according to the wavelength of incident light.
Figure 5:
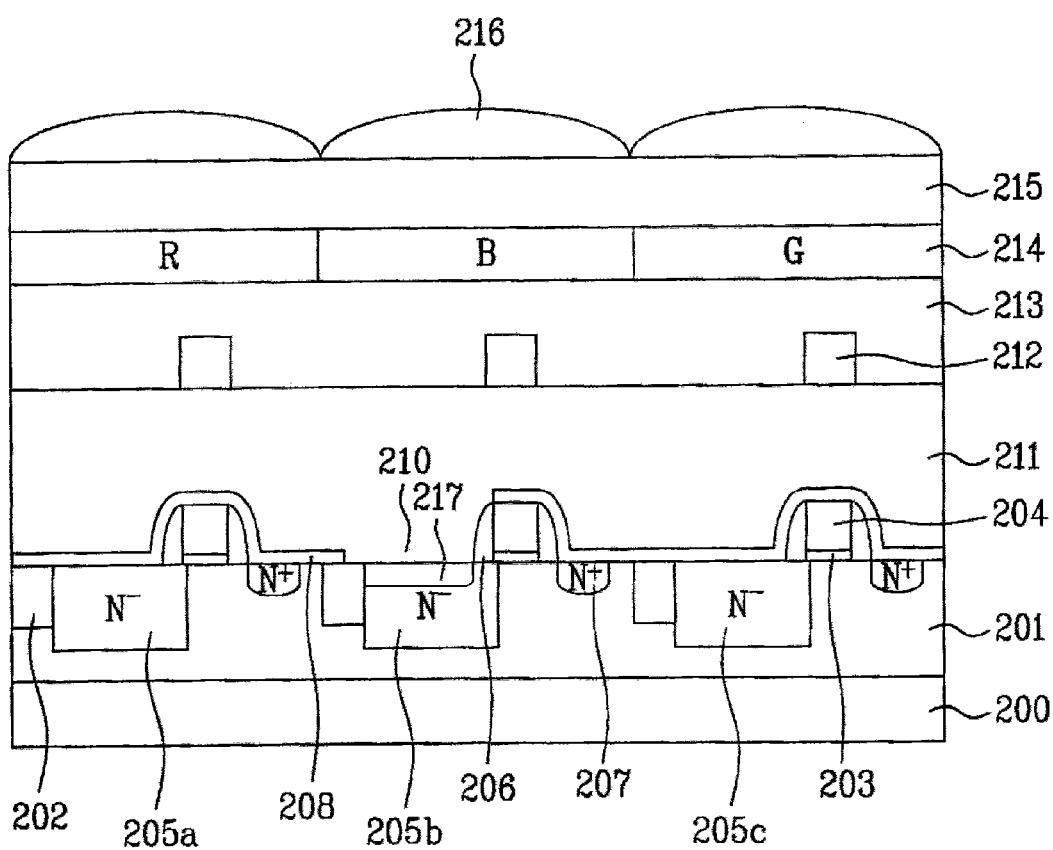
FIG. 5 is a cross-sectional view illustrating a CMOS image sensor according to the present invention.

FIG. 5 is a cross-sectional view illustrating a CMOS image sensor according to the present invention.

As shown in FIG. 5, a P+ type epitaxial layer 201 is formed on a P++ type semiconductor substrate 200 having an active region (including a photo diode region and a transistor region), and an isolation region. The active region and isolation regions are defined by a field isolation structure (e.g., a field oxide formed by local oxidation of silicon [LOCOS] and/or a trench oxide formed by shallow trench isolation [STI]). For example, an isolation layer 202 is formed in the isolation region of the substrate 200 for isolation of green, red, and blue light absorption regions. Moreover, N− type diffusion regions 205a, 205b, and 205c are respectively formed in the photo diode regions of the substrate 200.

In addition, gate electrodes 204 are formed on the transistor region of the substrate 200, and gate insulating layers 203 are interposed between the substrate 200 and the gate electrodes 204. Insulating sidewalls 206 are formed on both sides of each gate electrode 204. Moreover, a diffusion blocking layer 208 is formed over substantially the entire surface of the substrate 200, covering the gate electrodes 204. Especially, the diffusion blocking layer 208 has an opening 210 to expose a portion of the N− type diffusion region 205b.

An interlevel dielectric layer 211 is formed on the diffusion blocking layer 208. And, various metallization layers or wirings 212 are formed and spaced on the interlevel dielectric layer 211. In addition, a first planarization layer 213 is formed over the entire surface of the substrate 200, covering the metallization wirings 212. Furthermore, red (R), green (G), and blue (B) color filter layers 214 are formed on the first planarization layer 213, corresponding to each N− type diffusion region 205a, 205b, or 205c, respectively.

Then, a second planarization layer 215 is formed over the entire surface of the substrate 200, covering the color filter layers 214. Plural microlenses 216 are formed on the second planarization layer 215, respectively corresponding to each color filter layer 214. In other words, each microlens 216 corresponds to a single color filter 214 (which in turn corresponds to a single photodiode 205a, 205b or 205c). Here, the reference numeral "207" represents source/drain diffusion regions of each transistor.

In a CMOS image sensor according to the present invention, the nitride layer 208, functioning as a diffusion blocking layer, is selectively removed to form the opening 210 exposing the N− type diffusion region corresponding to the blue filter layer. Accordingly, incident light passing through the microlenses 216 can directly enter into the photo diode region via the blue color filter layer (e.g., without passing through a material such as silicon nitride that may absorb some portion of light having a wavelength associated with blue light). Opening 210 may expose some or all of the corresponding photodiode 205b. In one example, opening 210 expose substantially all of the "blue" photodiode 205b, while a corresponding opening over the "green" photodiode 205c (not shown) exposes a portion of the corresponding photodiode 205b, to enable a color reproducibility proportion closer to 1:1:1 for the CMOS sensor.

FIGS. 6a to 6f are cross-sectional views illustrating a preferred embodiment of a method for manufacturing a CMOS image sensor according to the present invention.

Figure 6A:
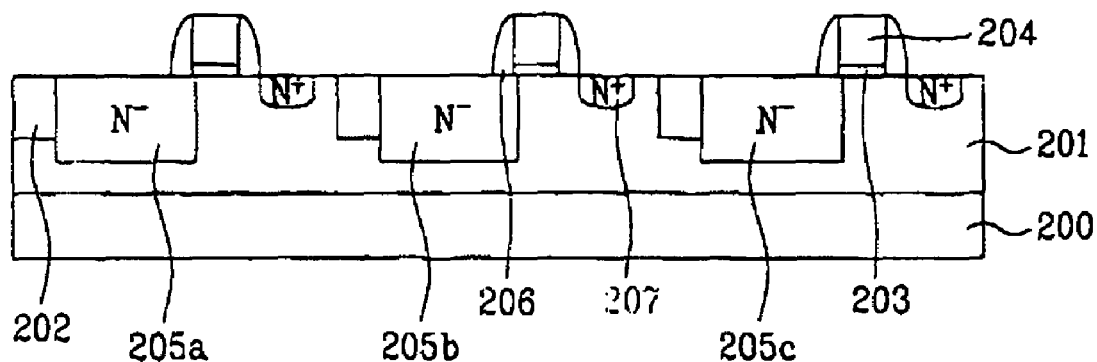
FIGS. 6a to 6f are cross-sectional views illustrating a preferred embodiment of a method for manufacturing a CMOS image sensor according to the present invention.

Referring to FIG. 6a, an epitaxial layer 201 having a low concentration and a first conductivity type (i.e., P− type) is formed on a semiconductor substrate 200 such as single crystalline silicon having a heavy concentration and the first conductivity type (i.e., P++ type). Here, the epitaxial layer 201 functions as a deep and wide depletion region in or for a photo diode. Thereby, the ability of a low-voltage photo diode for gathering photoelectrons can be improved, and also the light sensitivity can be improved. In addition, the semiconductor substrate 200 has an active region (which includes a photo diode region and a transistor region) and an isolation region. An isolation layer 202 may be formed in the isolation region by a shallow trench isolation (STI) process or a local oxidation of silicon (LOCOS) process.

Next, a gate insulating layer 203 and a conductive layer (e.g., a heavily doped polysilicon layer) are deposited on an entire surface of the epitaxial layer 201 including the isolation layer 202, in successive order, and they are selectively patterned using photolithography and etching processes, thus forming gate electrodes 204. Here, the gate insulating layer 203 can be formed using a thermal oxidation process or chemical vapor deposition process, and a silicide layer can be formed on the gate electrode by a conventional silicidation process. Thus, the gate insulating layer 203 may comprise a thermal oxide or a CVD oxide, which may be a plasma-enhanced CVD oxide formed from silane or tetraethyl orthosilicate (TEOS).

Moreover, an additional thermal oxidation process can be performed to form a thermal oxide layer (not shown) on surfaces of the gate electrode 204 and tile semiconductor substrate 200, respectively, after further processing (e.g., patterning of the gate electrode, ion implantation to form one or more of the photodiode, LDD, or source/drain terminals, etc.). Especially, a width of the gate electrode 204 can be greater than that of the conventional gate electrode, considering a thickness of the thermal oxide layer that will be formed on the peripheral surfaces thereof (which consumes some surface portion of the gate electrode 204, resulting in a gate having an effective width less than that of the patterned gate 204).

Then, N− type diffusion regions 205a, 205b, and 205c are formed in the photo diode region by ion-implantation of a low concentration of a second conductivity type dopant ions (i.e., N type dopant ions), typically by photolithographic mask (resist) patterning and ion implantation. Subsequently, an insulating layer is formed over the entire surface of the substrate 200, and then it is etched back (e.g., by anisotropic etching) to form insulating sidewalls 206 on sides of each gate electrode 204. The sidewalls may comprise an oxide (e.g., silicon dioxide), a nitride (e.g., silicon nitride), or a combination thereof (e.g., a thin oxide buffer layer with a nitride spacer thereon, a thin oxide buffer layer with a nitride-oxide bilayer spacer thereon, etc.). Next, a high concentration of the second (e.g., N) type dopant ions is implanted in the transistor region of the substrate 200 to form N+ type diffusion regions 207, typically by photolithographic mask (resist) patterning and ion implantation. N+ type diffusion regions 207 may be implanted at a lower energy, but at a higher dose, than N− type diffusion regions 205a, 205b, and 205c.

Figure 6B:
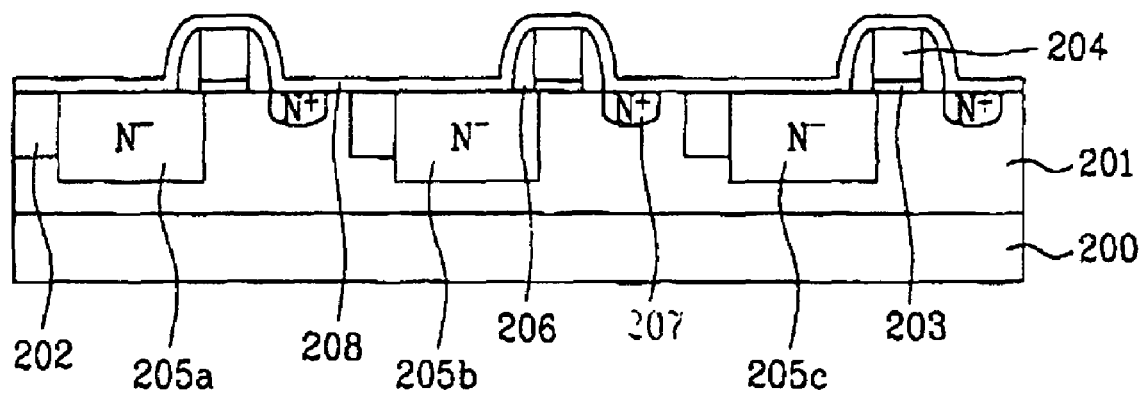

As shown in FIG. 6b, a heat-treatment process (e.g., a rapid thermal process) is performed to activate dopant ions in the N− type diffusion regions 205a, 205b, and 205c, and the N+ diffusion regions 207. Meanwhile, before forming the heavy concentration of N+ type diffusion regions 207, N− type diffusion regions (not shown) can be formed in the transistor region for a lightly doped drain structure, using a lower ion-implantation energy than that used for N+ type diffusion regions 207.

Next, a nitride layer 208, functioning as a diffusion blocking layer in the subsequent process(es), is formed over the entire surface of the substrate 200. Here, the nitride layer 208 preferably has a thickness of about 100 Å~600 Å; however, the thickness of the nitride layer 208 can be designed in a minimum thickness, considering its function of blocking diffusion of impurities and the effects of rejection of light of various wavelengths off its upper surface during image sensor operation.

Figure 6C:
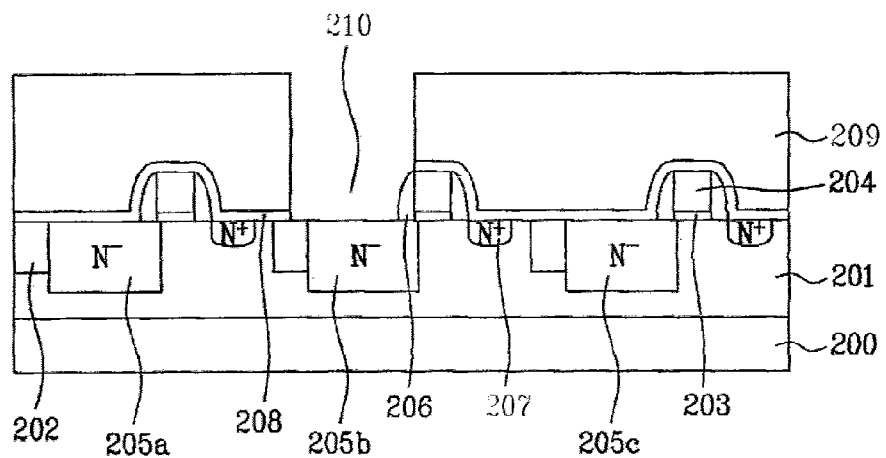

As shown in FIG. 6c, a photoresist layer is applied on the nitride layer 208, and then it is patterned by exposure and development processes, thus forming a photoresist pattern 209 exposing a top portion of the N− type diffusion region 205b. Next, using the photoresist pattern 209 as a mask, a portion of the nitride layer 208 on the N− type diffusion region 205b is selectively removed to form an opening 210. Here, the exposed portion of nitride layer 208 can be selectively removed using an isotropic etching process (e.g., aqueous phosphoric acid, which may be heated to a temperature of from about 50 to about 90° C.).

Figure 6D:
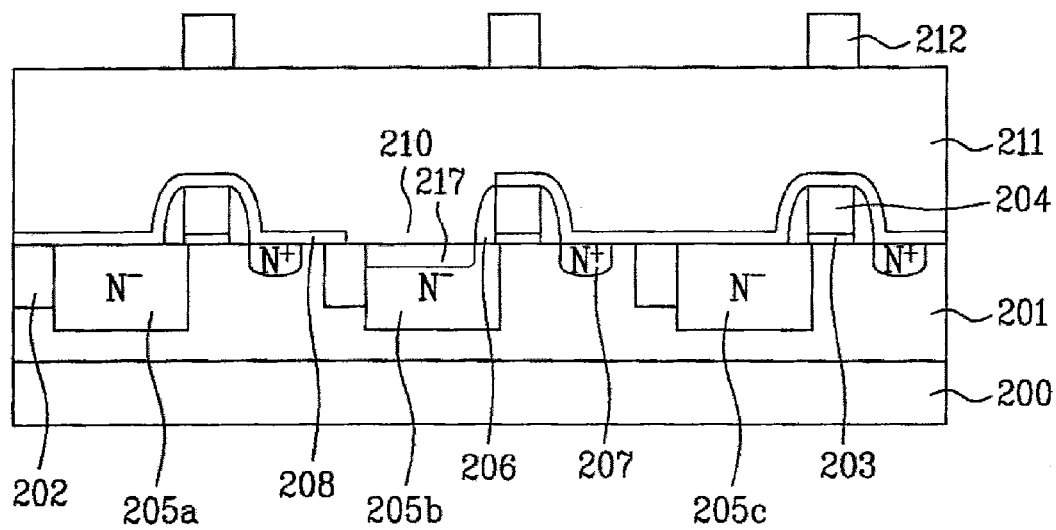

As shown in FIG. 6d, after removing the photoresist pattern 209, an interlevel dielectric 211 is formed over the entire surface of the substrate 200, covering the opening 210. Here, the interlevel dielectric layer 211 can be formed using a silane based material (e.g., a so-called "plasma silane"-based undoped silica glass, or USG), of which a large amount of hydrogen ions can occupy or recover dangling bonds of the substrate 200, thus enabling effective reductions in dark current. Thereafter, a metal layer is deposited on the interlevel dielectric layer 211, and then it is selectively etched by photolithography and etching processes, thus Forming metal layer (or various metal wirings) 212.

Figure 6E:
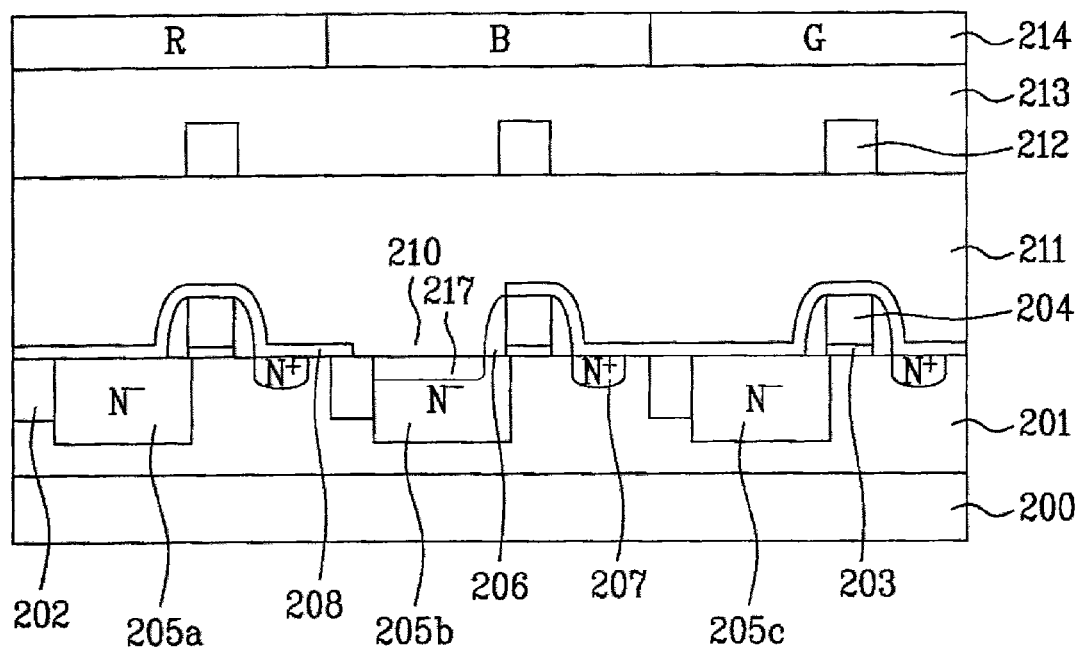

As shown in FIG. 6e, a first planarization layer 213 is formed over the entire surface of the substrate 200, covering the metal layer 212. Then, color filter layers 214 including red, blue, and green filters (R, B, and G), are formed on the first planarization layer 213, corresponding to the N− type diffusion regions 205a, 205b, and 205c, respectively. For example, a red filter R may be located over the portion of the substrate containing photodiode 205a, a blue filter B may be located over the portion of the substrate containing photodiode 205b, and a green filter G may be located over the portion of the substrate containing photodiode 205c.

Here, each color filler layer 214 can be formed in the following steps of: applying a corresponding chromophil resist on the first planarization layer 213, exposing and developing it to form a color filter pattern which typically comprises plural color filters that filter light by its wavelength. In addition, a photosensitive material (e.g., a given chromophil resist) may be applied in a thickness of 1 μm~5 μm, and it may be patterned by photolithography and etching processes using a separate mask (e.g., a separate mask for each color), thus forming single layer of each color filter 214 that filters light by its wavelength.

Figure 6F:
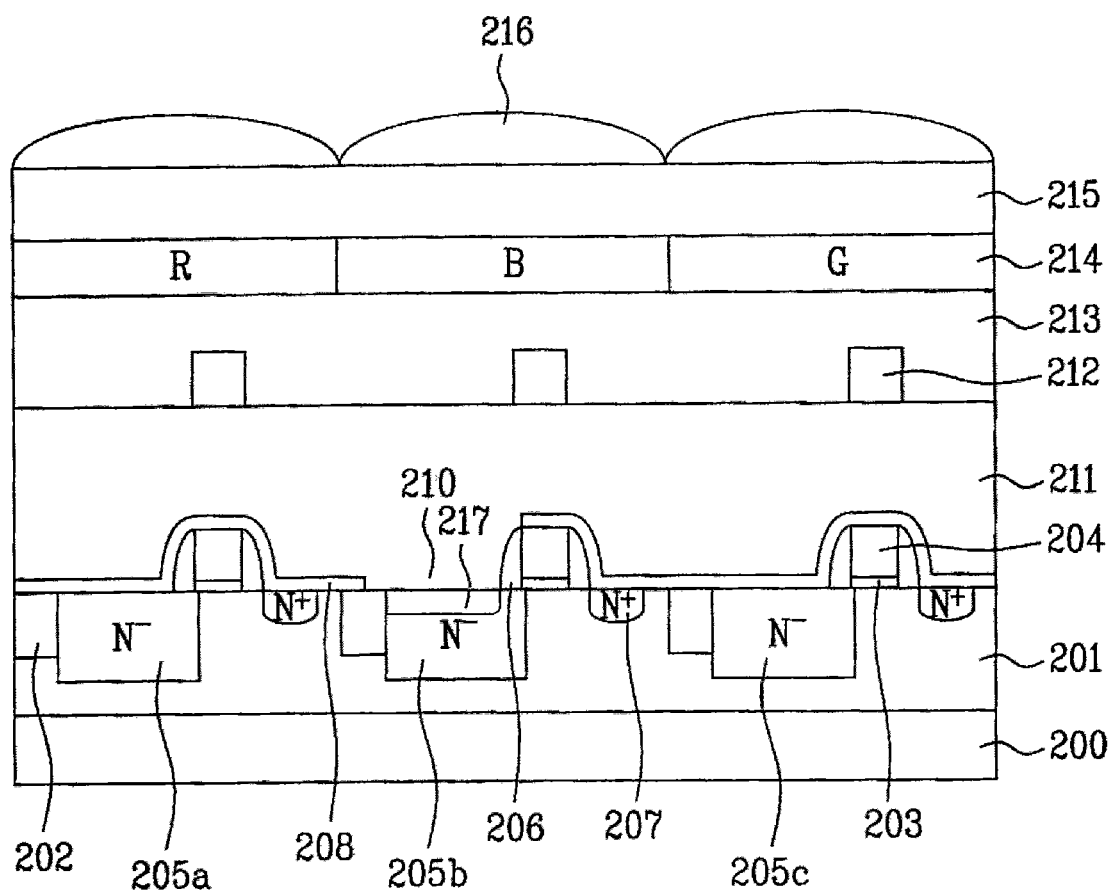

As shown in FIG. 6f, a second planarization layer 215 is formed over the entire surface of the substrate 200, covering the color filter layers 214. Here, the second planarization layer 215 can comprise a silicon nitride layer, in order to prevent infiltration of water or heavy metals, etc., from the ambient, and to improve the reliability and EMC properties of package products. Also, the second planarization layer 215 preferably has a thickness of 1000 Å~6000 Å, in order to prevent any interference of or by the thin films according or relating to the thickness of the planarization layer 215. This is generally because optical transmission is an important factor in an image sensor, and a number of optical transmission phenomena can cause different effects depending on the thicknesses of the thin films in the image sensor.

Next, a photoresist material for a microlens is applied over the entire surface of the substrate 200, covering the second planarization layer 215. The microlens functions to effectively condense light in the N− type diffusion regions 205a, 205b, and 205c. Thereafter, the applied photoresist material is selectively patterned by exposure and development processes to form microlens patterns.

Here, in the case where the photoresist material is a positive resist, one may advantageously resolve photoactive compounds in an initiator as an absorber of the photoresist material, in order to improve the transmittance thereof. Accordingly, the remaining photoactive compounds in the microlens patterns are preferably resolved by flood exposure of the photoresist material. In addition, the flood exposure process can generate photo acid so that the flowability of microlenses can he increased. As a result, subsequently, the substrate 200 including the microlens patterns may be placed on a hot plate (not shown) and heat-treated at a temperature of 300° C.~700° C. As a result, the microlens patterns are reflowed to form hemispherical microlenses 216. Next, the reflowed microlenses 216 are cooled. Here, the cooling treatment can be performed on a cool plate or in a cooling chamber where the substrate 200 can be placed.

In general, a CMOS sensor may have problems when the performance (e.g., an ability to store charges) deteriorates due to increase of dark currents. Dark currents may be generated by electrons transferring from the photo diode region to other regions without incidence of light to the photo diode region. The dark current may induce serious problems, such as degradation of CMOS image sensor performance, especially under or in a low illumination environment. Therefore, a conventional CMOS image sensor typically comprises a P° type diffusion region in the vicinity of the surface of the photo diode region, in order to reduce dark currents generating in the vicinity of the surface of the silicon substrate.

However, in a CMOS image sensor according to the present invention, the interlevel dielectric layer 211 can comprise and/or be formed using a BSG (Boro-Silicate Glass), PSG (Phospho-Silicate Glass), or BPSG; (Boron-Phosphorus-Silicate (Glass) material containing P type dopants. Utilizing out-diffusion of P-type dopants from such materials, a P+ type diffusion region 217 can be selectively formed on a photoreceptive surface of a silicon substrate (e.g., in a blue photo diode region), wherein electrons causing dark currents can be combined or rejoined with P type impurities, thus resulting in reduction or elimination of dark currents.

More specifically, in a conventional method, P° type diffusion regions are formed in every photo diode region, in order to reduce dark currents. However, according to the present invention, a P° type diffusion region can be selectively formed (e.g., only in a blue photo diode region), because the diffusion blocking nitride layer on the blue photo diode region can be selectively removed. Namely, the blue photo diode region can be exposed by opening the diffusion blocking nitride layer, thus the P° type diffusion region can be selectively formed in the exposed blue photo diode region.

The above-described method for manufacturing a CMOS image sensor according to the present invention has advantages as follows.

First, selective removal of a diffusion blocking nitride layer from a photoreceptive portion of a substrate (e.g., over a blue photo diode region) can prevent reflection of light by the nitride layer, and improve transmittance of blue light. As a result, color reproducibility of blue, green, and red lights can be adjusted in relatively equal proportions (e.g., approaching or equal to about 1:1:1), and total color reproducibility of a CMOS image sensor can be improved.

Second, the resolution of a CMOS image sensor can be improved according to improvement of the color reproducibility.

Third, a P° type diffusion region, which may be formed in a photo diode region for reduction of dark currents, can be freely designed according to the present method.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A CMOS image sensor, comprising:
   a first, second, and third photo diodes doped with an N type dopant and a plurality of transistors spaced at a predetermined distance in a semiconductor substrate;
   a diffusion blocking layer on a surface of the substrate, wherein the diffusion blocking layer has an opening selectively exposing at least one of the photo diodes;
   an interlevel dielectric layer comprising a P-type dopant formed over the entire surface of the substrate, covering the diffusion blocking layer and directly connecting to the at least one of the photo diodes via the opening in the diffusion blocking layer;
   red, blue, and green filter layers over the interlevel dielectric layer, respectively corresponding to the first, second and third photo diodes, wherein the opening in the diffusion blocking layer corresponds to at least one of the blue and green color filter layers;
   a plurality of microlenses over the color filter layers, corresponding to each color filter layer; and
   a P+ diffusion region formed on a surface of at least one of the photo diodes via the opening in the diffusion blocking layer.

2. The CMOS image sensor of claim 1, wherein the diffusion blocking layer comprises a nitride.

3. The CMOS image sensor of claim 1, wherein the photo diodes comprise a dopant having a conductivity type opposite to a dopant in the interlevel dielectric layer.

4. The CMOS image sensor of claim 1, wherein the interlevel dielectric layer comprises phosphosilicate glass (PSG), borosilicate glass (BSG), or borophosphosilicate glass (BPSG).

5. The CMOS image sensor of claim 1, further comprising a planarization layer between the color filter layers and the plurality of microlenses.

6. The CMOS image sensor of claim 1, wherein the diffusion blocking layer has a thickness of 100 Å~600 Å.

7. The CMOS image sensor of claim 1, wherein the diffusion blocking layer does not expose the photodiode corresponding to the red color filter.

8. The CMOS image sensor of claim 1, wherein the interlevel dielectric layer is on the diffusion blocking layer over the photodiode corresponding to the red color filter.

9. The CMOS image sensor of claim 1, wherein the interlevel dielectric layer comprises a borosilicate glass (BSG) or borophosphosilicate glass (BPSG) layer.

10. A method for manufacturing a CMOS image sensor, comprising the steps of:
   forming a first, second, and third photo diodes doped with an N type dopant and a plurality of transistors spaced at a predetermined distance in a semiconductor substrate;
   forming a diffusion blocking layer on an entire surface of the substrate;
   selectively removing the diffusion blocking layer to form an opening exposing at least one of the photo diodes;
   forming an interlevel dielectric layer comprising a P-dopant over the entire surface of the substrate and directly connecting the interlevel dielectric layer to the at least one of the photo diodes via the opening of the diffusion blocking layer;
   forming a P+ diffusion region on a surface of at least one of the photo diodes via the opening in the diffusion blocking layer;
   forming red, blue, and green color filter layers over the interlevel dielectric layer, respectively corresponding to the first to third photo diodes, wherein the opening in the diffusion blocking layer corresponds to at least one of the blue and green filter layers; and
   forming a plurality of microlenses over the color filter layers, respectively corresponding to each color filter layer.

11. The method of claim 10, wherein the diffusion blocking layer comprises a nitride layer.

12. The method of claim 10, wherein the diffusion blocking layer is formed in a thickness of 100 Å~600 Å.

13. The method of claim 10, wherein the photo diodes comprise a dopant having a conductivity type opposite to the p-dopant in the interlevel dielectric layer.

14. The method of claim 10, wherein the interlevel dielectric layer comprises phosphosilicate glass (PSG), borosilicate glass (BSG), or borophosphosilicate glass (BPSG).

15. The method of claim 10, further comprising the step of forming a planarization layer on the color filter layers, wherein the plurality of microlenses are formed on the planarization layer.

16. The method of claim 10, wherein selectively removing the diffusion blocking layer comprises an isotropic etching process.

17. The method of claim 10, further comprising implanting the P-dopant in the interlevel dielectric layer.

18. The method of claim 10, wherein the diffusion blocking layer remains on the photodiode corresponding to the red color filter after the selectively removing step.

19. The method of claim 10, wherein the interlevel dielectric layer is formed on the diffusion blocking layer over the photodiode corresponding to the red color filter.

20. The method of claim 10, wherein the interlevel dielectric layer comprises a borosilicate glass (BSG) or borophosphosilicate glass (BPSG) layer.

* * * * *